(12) United States Patent
Saha et al.

(10) Patent No.: US 9,838,629 B2
(45) Date of Patent: Dec. 5, 2017

(54) PIXEL ARRAY AND METHOD FOR CONTROLLING A PIXEL ARRAY

(71) Applicants: STMicroelectronics (Research & Development) Limited, Marlow, Buckinghamshire (GB); The University Court of the University of Edinburgh, Edinburgh (GB)

(72) Inventors: Shatabda Saha, Edinburgh (GB); John Kevin Moore, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 213 days.

(21) Appl. No.: 14/731,761

(22) Filed: Jun. 5, 2015

(65) Prior Publication Data

US 2016/0037105 A1    Feb. 4, 2016

(30) Foreign Application Priority Data

Jul. 30, 2014    (GB) .................................... 1413519.8

(51) Int. Cl.
*H04N 5/3745*    (2011.01)
*H04N 5/369*    (2011.01)
*H01L 27/146*    (2006.01)

(52) U.S. Cl.
CPC ..... *H04N 5/3698* (2013.01); *H01L 27/14641* (2013.01); *H04N 5/37457* (2013.01)

(58) Field of Classification Search
CPC .............. H04N 5/3698; H04N 5/37457; H01L 27/14641
See application file for complete search history.

(56) References Cited

U.S. PATENT DOCUMENTS

| | | |
|---|---|---|
| 7,459,667 B1 | 12/2008 | Lee et al. |
| 2008/0284882 A1 | 11/2008 | Mori et al. |
| 2010/0271523 A1 | 10/2010 | Hara |
| 2011/0062314 A1 | 3/2011 | Doege |
| 2011/0193983 A1 | 8/2011 | Uchida |
| 2012/0049042 A1 | 3/2012 | Lim et al. |
| 2012/0188424 A1 | 7/2012 | Li |
| 2012/0262613 A1 | 10/2012 | Kono et al. |
| 2013/0146749 A1* | 6/2013 | Cieslinski .............. H04N 5/378 250/208.1 |

OTHER PUBLICATIONS

UK-IPO Search Report for GB1413519.8 dated Jan. 22, 2015 (4 pages).

* cited by examiner

*Primary Examiner* — Tony Ko
(74) *Attorney, Agent, or Firm* — Gardere Wynne Sewell LLP

(57) ABSTRACT

A pixel array includes pixels arranged in columns. A pair of column lines is provided for each column of pixels. A current source circuit is coupled to each pair of column lines. The current source circuit provides current to the pair of column lines in a first mode of operation such that when one column line in a pair of column lines is being provided with a first current the other column line in the pair of column lines is being provided with a second current which is less than the first current.

25 Claims, 8 Drawing Sheets

PIXEL ARRAY AND METHOD FOR CONTROLLING A PIXEL ARRAY

PRIORITY CLAIM

This application claims priority from Great Britain Application for Patent No. 1413519.8 filed Jul. 30, 2014, the disclosure of which is incorporated by reference.

TECHNICAL FIELD

This application is directed to pixel arrays and, in particular, to controlling the operation of pixel arrays.

BACKGROUND

Image sensors using photodiode pixels, typically implemented in CMOS architecture, are well known. Such image sensors in many applications may have the image sensitive element and the image processing circuitry provided in integrated circuitry which can be manufactured using CMOS techniques.

SUMMARY

According to an aspect, there is provided a pixel array comprising: a plurality of pixels arranged in a plurality of columns; a plurality of pairs of column lines, each pair being associated with a column of pixels; a current source arrangement configured to provide current to said columns lines in a first mode of operation, said current source being arranged such that when one of a pair of said column lines is being provided with a first current, the other of said pair is being provided with a second current which is less than the first current.

In some embodiments, one of said pair may be configured to be active when provided with said first current and the other of said pair is configured to be inactive when provided with said second current.

The first current may be n times larger than the second current where n is in the range of 2 to 10. The value n may be 6 or 7.

In some embodiments the first current may be n times larger than the second current where n is greater than one. The value n may be an integer or a non integer.

The current source arrangement for each pair of column lines may comprise a plurality of current sources and a switching arrangement, said switching arrangement configured to control which current source is coupled to which column line.

In some embodiments, for each current source, a first switch and a second switch may be provided, said first switch for coupling said current source to a first of said column lines and said second switch for coupling said current source to a second of said column lines.

The current source arrangement may be configured in a second mode of operation to couple said current sources to both of said column lines.

The current source arrangement may be configured in a third mode of operation to cause to said current provided to each of said column lines to be less than to the first current.

The current source arrangement may be configured to provide a total current of xi, said current sources of said current source arrangement being individually selectable to provide a current of i, xi and any integer between 1 and x, x being an integer.

In some embodiments, x may be 8. In other embodiments, x may be any other suitable value, for example between 2 and 10.

In some embodiments, four current sources may be provided, two current sources each providing a current of i and two current sources each providing a current of 3i.

One or more integrated circuits may comprise an arrangement described above. Some embodiments may be provided by one or more dies. Some embodiments may be provided by one or more dies and one or more integrated circuits.

According to another aspect, there is provided a method of controlling a pixel array, said pixel array comprising a plurality of pixels arranged in a plurality of columns and a plurality of pairs of column lines, each pair being associated with a column of pixels, said method comprising: providing current to said a pair of column lines in a first mode of operation, such that one of the pair of said column lines is provided with a first current and the other of said pair is being provided with a second current which is less than the first current.

The providing may comprise providing said first current such that said one of said pair is active and providing said second current such that the other of said pair is inactive.

The first current may be n times larger than the second current where n is in the range of 2 to 10. The value n may be 6 or 7.

The controlling may comprise which of a plurality of a plurality of current sources is coupled to which column line.

The controlling may comprise controlling one or more of a first switch and a second switch, said first switch for coupling a current source to a first of said column lines and said second switch for coupling said current source to a second of said column lines.

The method may comprise, in a second mode of operation, to coupling one or more of said current sources to both of said column lines.

The method may comprise, in a third mode of operation, causing the current provided to each of said column lines to be less than the first current.

BRIEF DESCRIPTION OF THE DRAWINGS

Reference is now made by way of example only to the accompanying drawings in which.

DETAILED DESCRIPTION OF THE DRAWINGS

Figure 1:
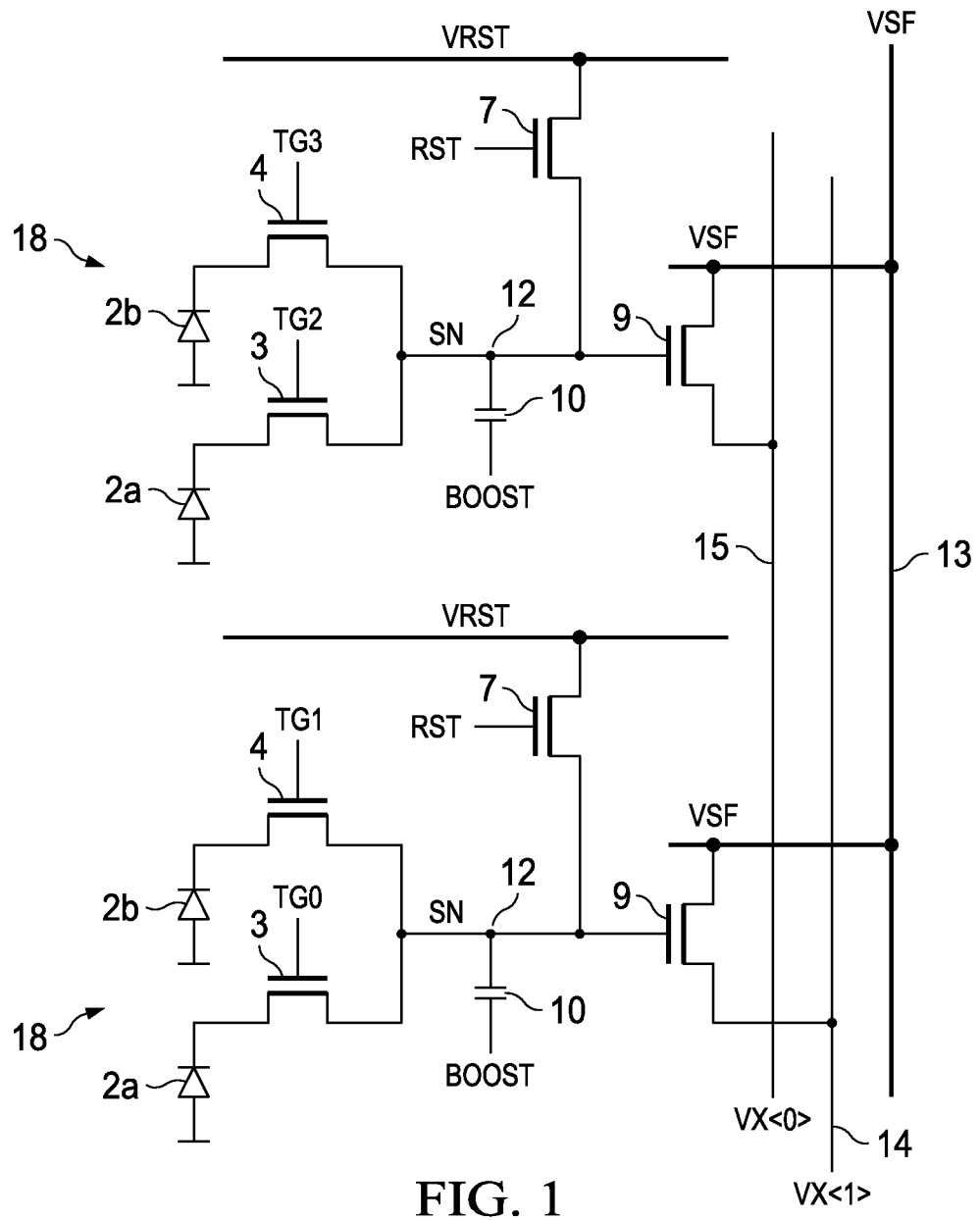
FIG. 1 shows a two transistor (2T) pixel arrangement.

A CMOS image sensor has a pixel array. FIG. 1 shows a pixel architecture, based on what is known as a 2T (two transistor) pixel. In the example shown, each pixel arrangement 18 provides two pixels which share some circuitry. Two pixel arrangements are shown in FIG. 1. Each pixel of the pixel arrangement 18 comprises a photodiode 2a or 2b and a respective transfer gate transistor 3 or 4. The two pixels of a pixel arrangement share a source follower transistor 9 and a reset transistor 7. These transistors act to reset, expose and then read out data from the photodiode. The transfer gate transistor 3 or 4 is controlled by a respective signal TG and the reset transistor 7 is controlled by a reset signal RST. The source follower transistor 9 has its gate tied to a sense node 12.

In more detail, the reset transistor 7 receives the reset signal RST at its gate, its drain is connected to a voltage VRST and its source is connected to the sense node 12. The source follower transistor 9 has its drain connected to a source follower supply voltage VSF and its source connected to a read line Vx. The source follower transistor 9 of the first pixel arrangement is coupled to a first read line Vx0 15 and the source follower transistor 9 of the second pixel arrangement is coupled to a second read line Vx1 14. The read line provides an output voltage Vx indicative of the amount of light detected by the photodiode. The transfer gate transistor 3 or 4 has its gate coupled to its respective control signal TG. The drain of the transfer gate transistors are connected to the sense node 12 whilst their source is connected to the respective photodiode 2a or 2b.

The transistors typically operate with a pinned photodiode structure and Correlated Double Sampling (CDS) to remove "kTC" noise associated with the reset operation. In Correlated Double Sampling, the output of the pixel is measured twice: once in a reset condition (in this case at "black level" when the only level change is resultant from noise) and once in a condition including the signal (which still includes the "black level" noise). The value measured from the signal condition is then subtracted from the reset condition so as to remove the "black level" noise offset. The double sampling operation also removes fixed noise sources such as variation in the threshold voltage of the source follower transistor.

The pixel needs to have appropriate voltage levels applied at defined time intervals. The voltage levels of the control signal TG is used to control the transfer of the pixel signal level to the sense node. The reset voltage is used to reset the sense node and photodiode. The reset signal RST and the reset voltage VRST are used to control when the pixel is read. For example, no read output is provided if the reset voltage VRST is relatively low and the reset signal RST is relatively high and the pixel is read if the reset voltage VRST is relatively high and the reset signal RST is relatively low.

The amount of charge that a photodiode can collect before saturating is known as the full well. It is desirable to have a large full well so that many photons can be collected from the incoming illumination and the imaging range extended. During the pixel read operation the collected charge is transferred to the sense node which causes a downward voltage change (of which the magnitude is determined by the capacitance 10 on the sense node).

Figure 2:
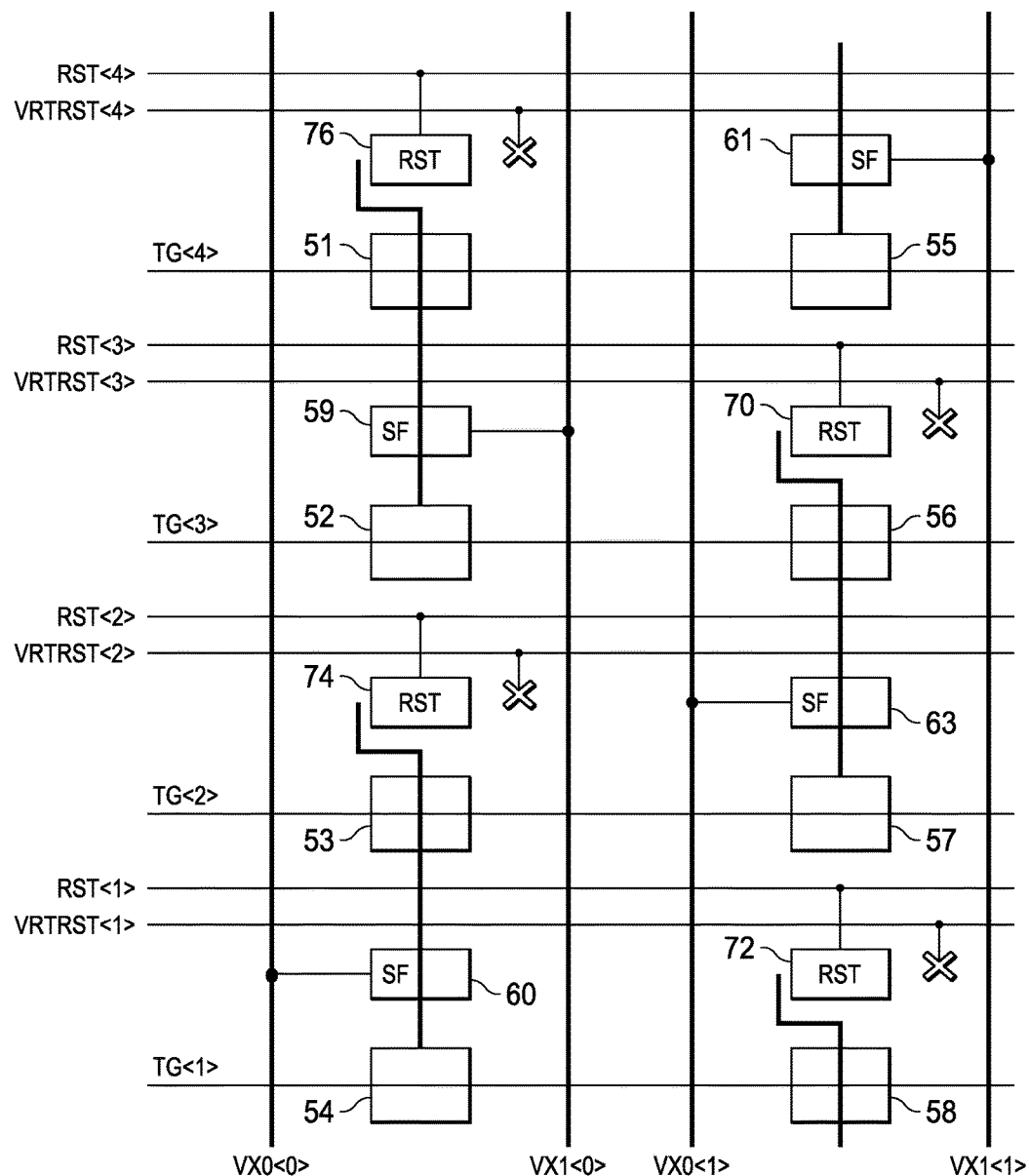
FIG. 2 shows schematically an array of pixels.

Reference is made to FIG. 2 which schematically shows an array of pixels. The array shown in FIG. 2 has eight pixels. In some embodiments, there may be many more than eight pixels. In FIG. 2, 8 pixels 51 to 58 are shown. Pixels 51, 52, 53 and 54 are arranged in a column with a first read line VX0 arranged on one side of the column and the second read line VX1 arranged on the other side of the column. Likewise, pixels 55, 56, 57 and 58 are arranged in a column. The first read line VX0 for that column is arranged on one side of the column with the second read line VX1 for that column arranged on the other side of the column. A source follower (SF) transistor 59 is shared between the first and second pixels 51 and 52 of a column while a second source follower transistor 60 is shared between the third and fourth pixels 53 and 54. Similarly, a source follower transistor 63 is shared between the sixth and seventh pixels 56 and 57. A source follower transistor 61 is shared between the fifth pixel 55 and the pixel above the fifth pixel (not shown). A source follower transistor (not shown) is shared between the eighth pixel and the pixel below the eighth pixel. It should be appreciated that the first through eighth pixels each correspond to a pixel arrangement shown in FIG. 1.

A first reset transistor 76 is shared between the first and second pixels 51 and 52 of a column while a second reset transistor 74 is shared between the third and fourth pixels 51 and 54. Similarly, a reset transistor 70 is shared between the sixth and seventh pixels 56 and 57. A reset transistor (not shown) is shared between the fifth pixel 55 and the pixel above the fifth pixel (not shown). A reset transistor 72 is shared between the eighth pixel and the pixel below the eighth pixel (not shown).

Figure 3:
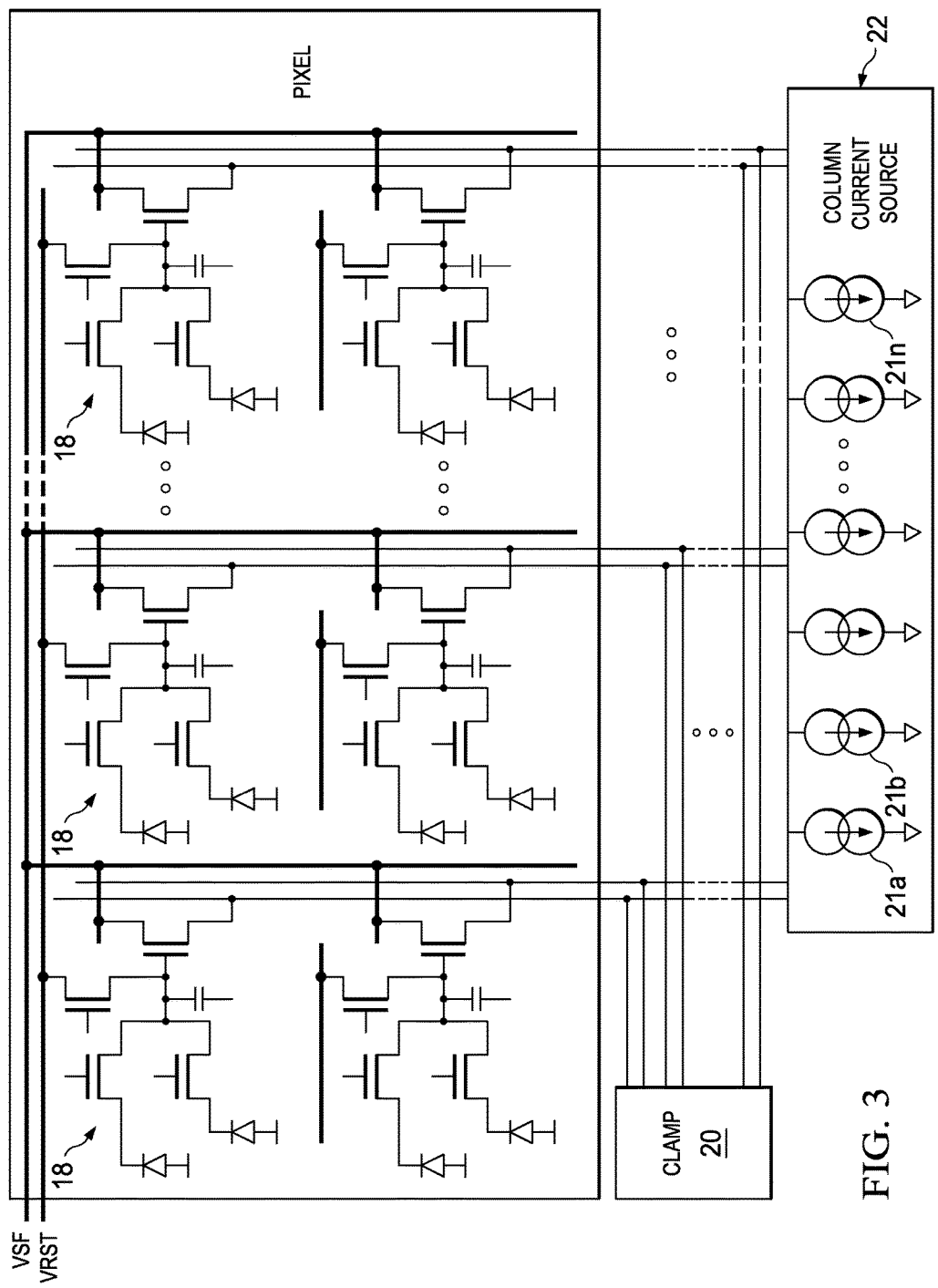
FIG. 3 schematically shows control of read lines of the pixel array.

Reference is made to FIG. 3 which schematically shows a current source arrangement 22 comprising current sources 21a to 21n respectively associated with the plurality of column line pairs. A clamp 20 is provided. During a single read line time only one Vx line (e.g. Vx0 or Vx1) is active at a time.

Figure 4A:
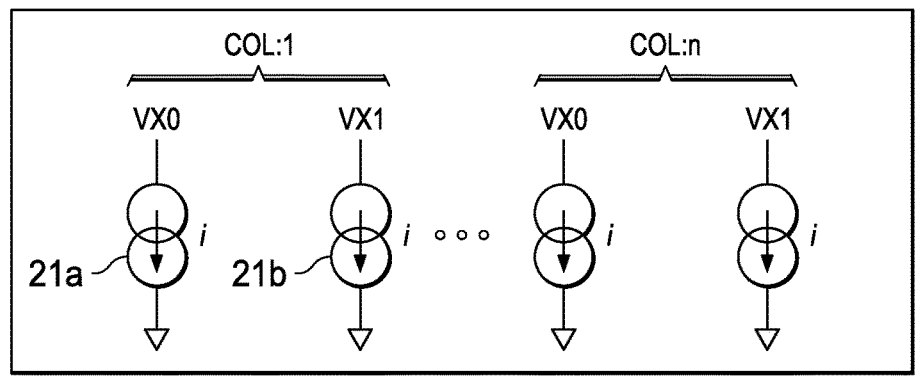
FIGS. 4A and 4B show two examples of current steering with respect to the read lines.

In one alternative illustrated in FIG. 4A each of the Vx lines are biased with the same current. This means the overall current consumption is increased compared to a single Vx line implementation. Thus, each of the Vx lines is provided with a respective current source 21b.

Figure 4B:
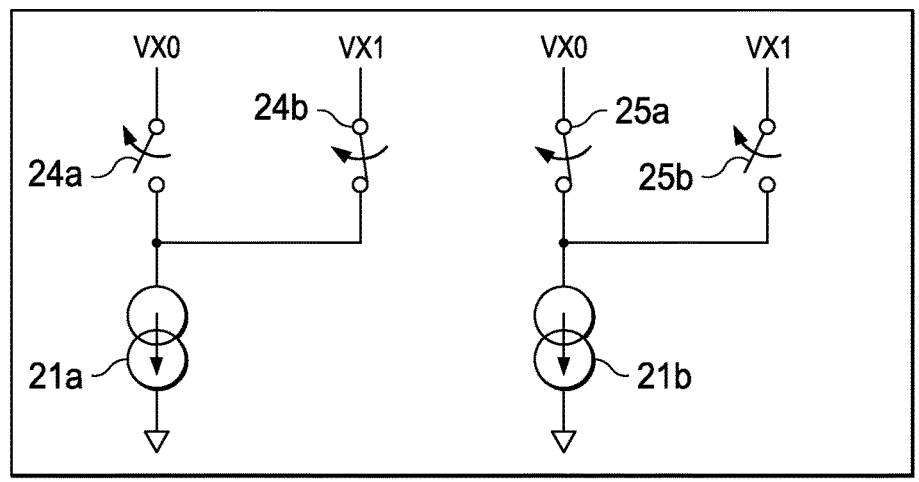

In one alternative shown in FIG. 4B, the current can be switched off in the non active Vx line. In this case the current can be steered through either of the Vx lines by control controlling respective switches 24 and 25. Each line of the pair will have a respective switch 24a/25a and 24b/25b. When the switch 24a/25a is open and switch 24b/25b is closed current is steered from the respective current source 21a/b through the Vx1 line. When the switch 24a/25a is closed and the switch 24b/25b is open then the current is steered through the Vx0 line. It should be appreciated that in practice, there will be a current source for each pair of lines and each pair of lines will have a switch in one line and a switch in the other line. In FIG. 4B, current source 21a and the switches 24a and 24b are in the positions such that the Vx1 line has the current steered through it. The current source 21b and the switches 25a and 25b are in the positions such that the Vx0 line has the current steered through it. The arrangement of FIG. 4B may have the disadvantage that the voltage of the non active Vx line is not well defined. This is may be disadvantageous because if the voltage on the non active Vx line is not well defined throughout the period in which black and signal levels are read, it is possible that some unwanted capacitive coupling effect could occur between the non-active line and the active pixel sense node, the active pixel Vx line, or nodes internal to the readout circuitry or column current sources.

Figure 5:
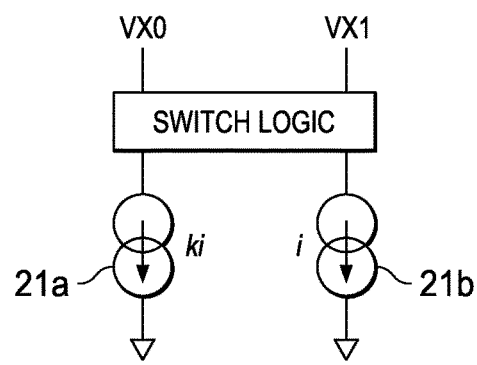
FIG. 5 shows current steering with respect to the read lines according to an embodiment.

Reference is made to FIG. 5 which shows an embodiment. Both of the Vx lines of a pair have a current source. The Vx line which is active (Vx0 in FIG. 5) will be provided with a first current, ki by its current source 21a. The VX line which is inactive (VX1 in FIG. 5) will also be provided with a current by its current source 21b. However, the current will be a fraction of that provided to the active line. The current will be i. The current provided to the in non-active line will be very much less than that provided to the active line. For example, k can be of the order of 7. The value of k can be any suitable values, some examples of which will be discussed later. Thus, in some embodiments, the current consumption is not significantly increased, as with the arrangement of FIG. 4A. Further, the disadvantages of the arrangement of FIG. 4B, where the state of the inactive VX line is not well defined are in avoided.

Figure 6:
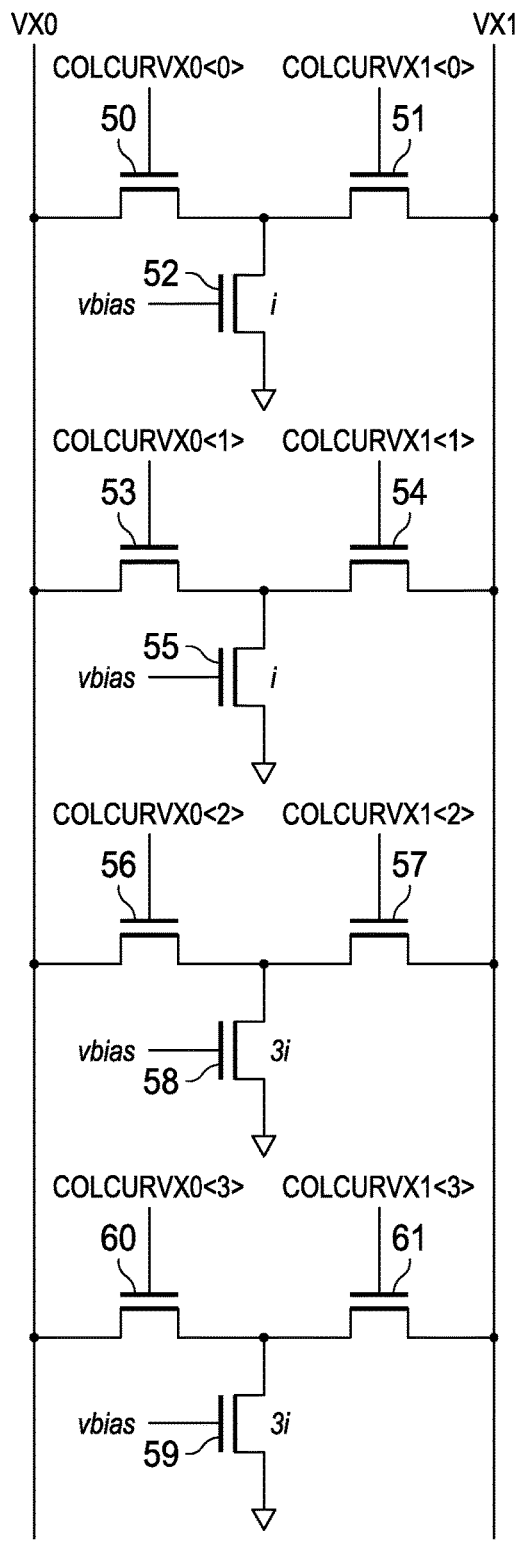
FIG. 6 schematically shows current steering with respect to read lines in an array using the arrangement of FIG. 5.

Reference is made to FIG. 6 which shows one embodiment for providing the required current to the VX lines.

In the arrangement shown in FIG. 6, one pair of the read lines VX0 and VX1 are shown. Between the VX lines are four current source arrangements. Each current source arrangement has a current source along with a pair of switches. The switches will allow the current source to be connected to either or both of the VX lines.

The first current source arrangement comprises a current source 52 in the form of a transistor which will provide a current of i. A first switch 50 (again in the form of a transistor) is provided which when closed will couple the current source 52 to the first VX line, VX0. A second switch 51, (again in the form of a transistor) will couple the current source 52 to the second VX line, VX1, when the switch is closed. The first switch is controlled by signal COLCURVX0<0>. The second switch 51 is controlled by the signal COLCURVX1<0>.

The second current source arrangement is similar to the first current source arrangement and also provides a current of i. The current source transistor is referenced 55 whilst the first switch is referenced 53 and the second switch 54. The first switch 53 is controlled by signal COLCURVX0<1> and second switch 54 is controlled by signal COLCURVX1<1>.

The third current source arrangement provides a current of 3i. The current source transistor is referenced 58 and the respective first and second switches are referenced 56 and 57. The first switch 56 is controlled by signal COLCURVX0<2> and the second switch 57 is controlled by signal COLCURVX1<2>.

The fourth current source arrangement provides a current of 3i. The current source transistor is referenced 59 and the first and second switches are respectively referenced 60 and 61. These transistors are respectively controlled by signals COLCURVX0<3> and COLCURVX1<3>.

Figure 7A:
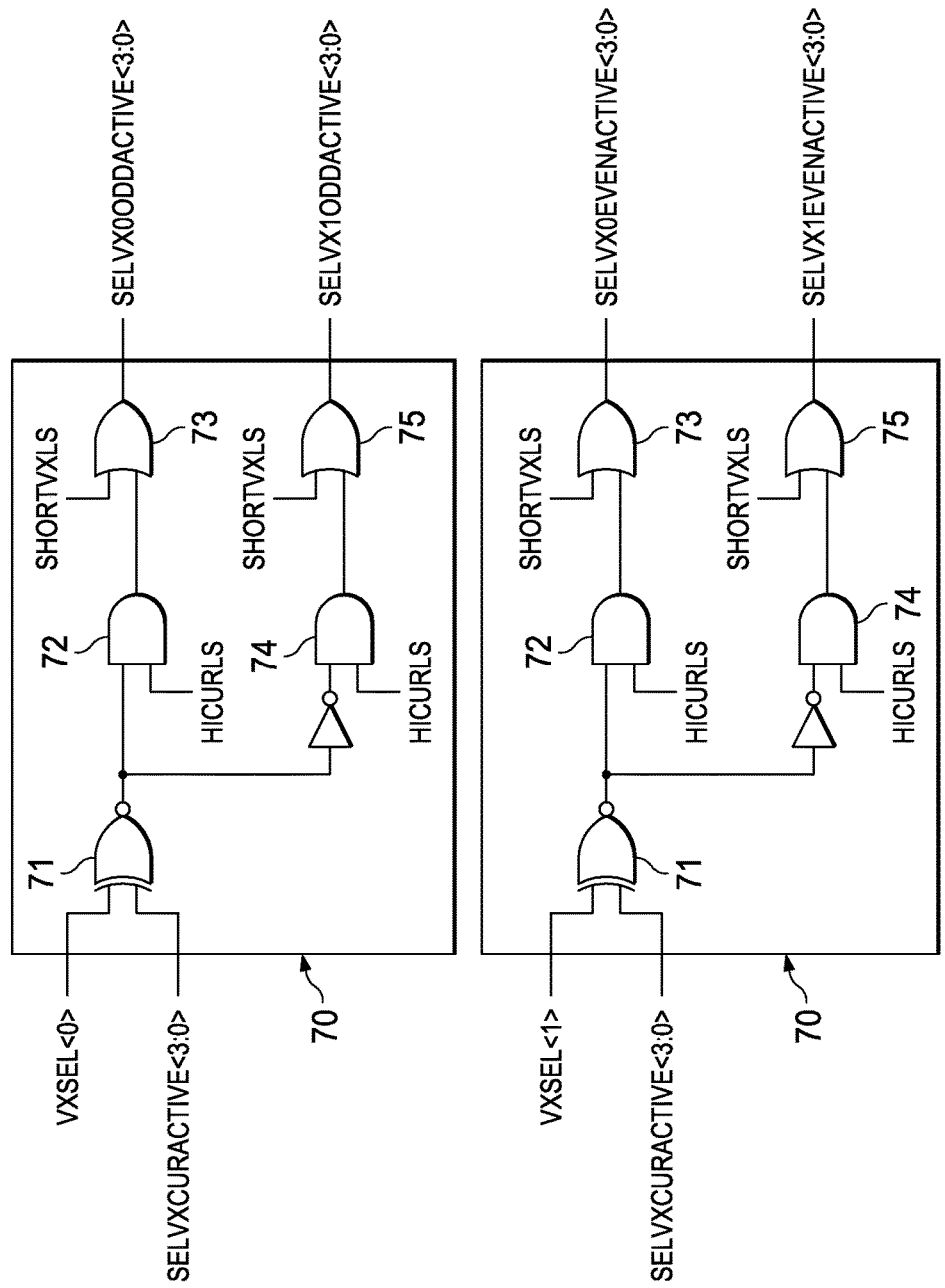
FIGS. 7A-7C schematically show an arrangement for controlling the current source arrangement.
Figure 7B:
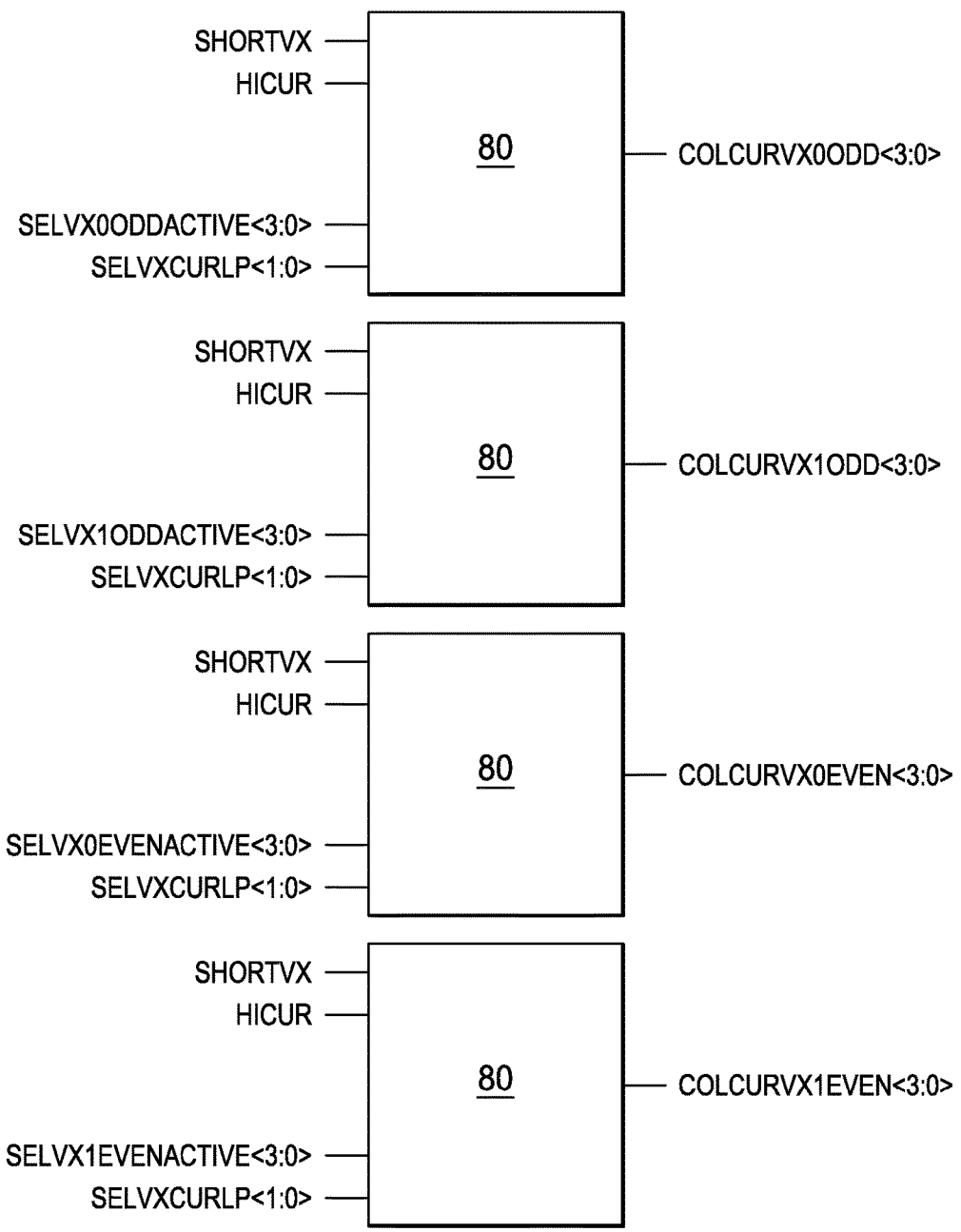
Figure 7C:
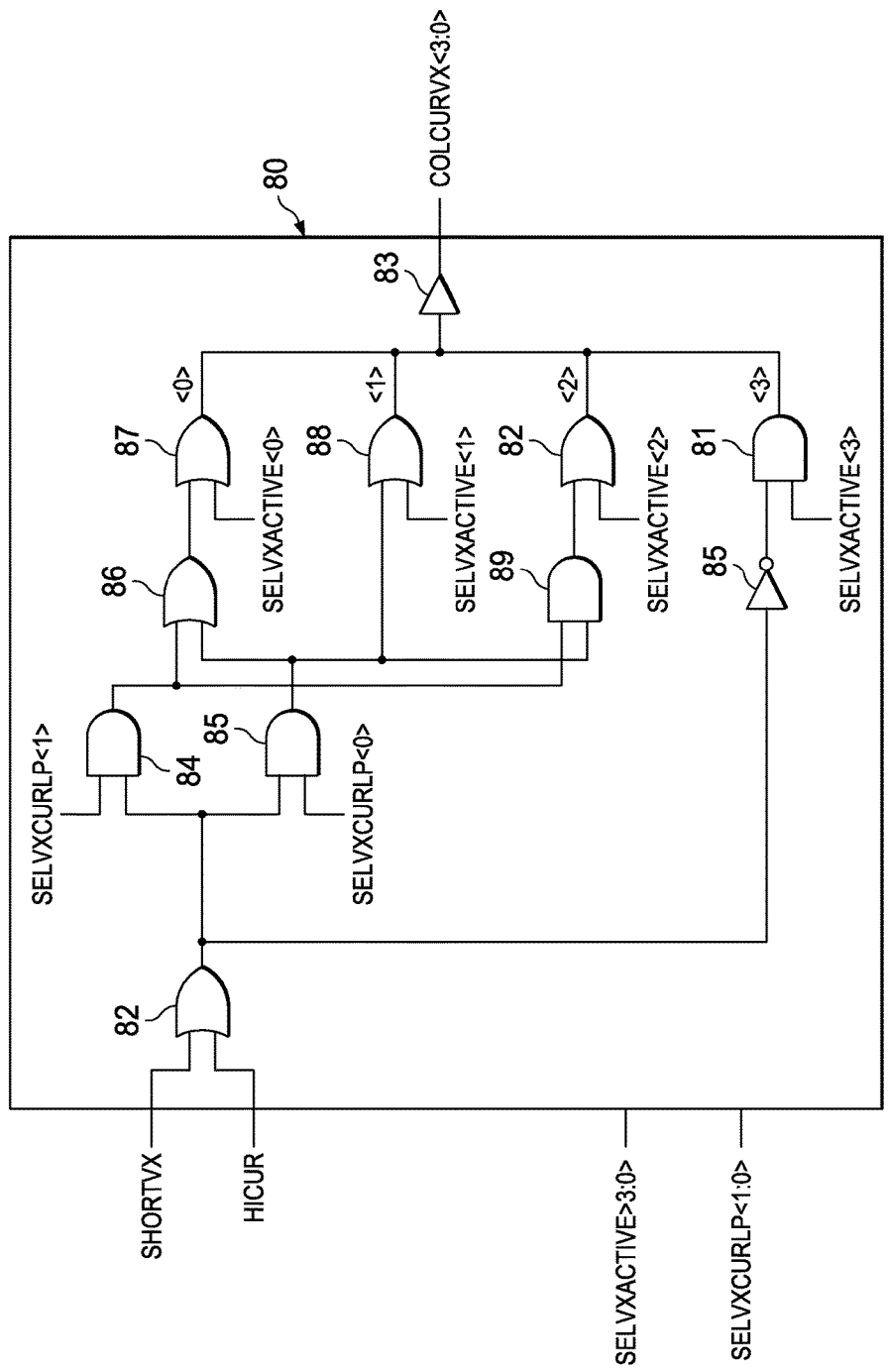

Reference is now made to FIGS. 7A-7C which provide switch selection logic for controlling the arrangement in FIG. 6.

Reference is first made to FIG. 7A and blocks 70. In the arrangement shown in FIG. 7A, two blocks 70 are provided. The first block 70 provides the signals SELVX0ODDACTIVE<3:0> and SELVX1ODDACTIVE<3:0>. The second block 70 will provide SELVX0EVENACTIVE<3:0> and SELVX1EVENACTIVE<3:0>.

The circuit configuration of the first block 70 will be described. The first block 70 comprises an XNOR gate 71 which receives a first input VXSEL<0> and a second input SELVXCURACTIVE<3:0>. The output of the first XNOR gate 71 is input to a first AND gate 72 which also receives a signal HICUR. The signal HICUR is used to denote a 'high power mode' and is asserted, when for example a read operation is to take place. The output of the XNOR gate 71 is also input to an inverter 77, the output of which is input to a second AND gate 74 along with the signal HICUR. The output of the first AND gate 72 is input to a first OR gate 73 which also receives the signal SHORTVX. The signal SHORTVX, which has a higher priority than the signal HICUR, when asserted, causes all of the switches of the arrangement of FIG. 6 to be controlled to short together the two VX lines. The output of the second AND gate 74 is input to a second OR gate 75 which also receives the signal SHORTVX. The output of the first OR gate is SELVX0ODDACTIVE<3:0> and the output of the second OR gate is SELVX1ODDACTIVE<3:0>.

The second arrangement 70 has the same circuit configuration but instead receives the input signal VXSEL<1> and provides the output signals as mentioned previously.

As shown in FIG. 7B, four further blocks 80 are shown. Each block 80 is configured to provide an output which controls two of the switches shown in FIG. 6. The first block is configured to control switches 53 and 60, the second block controls switches 54 and 61, the third block controls switches 50 and 56 and the fourth block controls switches 51 and 57. It should be appreciated that the circuitry of each of the blocks is the same. The circuitry of each of the further blocks 80 is shown in FIG. 7C.

In practice, the arrangement of FIGS. 7A-7C will control two sets of columns. It should be appreciate that the signal VXSEL is a 2 bit signal which can be 00, 01, 10 and 11. This means that the following combinations are selectable: VX0 of the first pair and VX0 of the second pair, VX0 of the first pair and VX1 of the second pair, VX1 of the first pair and VX0 of the second pair, and VX1 of the first pair and VX1 of the second pair. This means that an odd column (from one pair) and an even column (from the other pair) which are being addressed (or active) at the same time.

In particular, the first further block 80 provides the COLCURVX0ODD<3:0>signal, the second further block 80 provides the COLCURVX1ODD<3:0>signal, the third further block 80 provides the COLCURVX0EVEN<3:0>signal, and the fourth further block 80 provides the COLCURVX1EVEN<3:0>signal. The first further block will control the first VX0 column with the second block controlling the corresponding VX1 line. The third and fourth blocks will respectively control another VX0 and VX1 pair. Each output comprises four bits, one bit to control each transistor associated with the column. In particular, the output of each block will control whether a particular switch associated with a given column is on or off.

In more detail, each of the further blocks comprises a first NOR gate 82 which receives the signal SHORTVX and HICUR. It should be noted that only one of those signals will be asserted at a time. The output of the first XOR gate 82 is input to a first AND gate 84, a second AND gate 85 and an inverter 86. The first AND gate 84 also receives a signal SELVXCURLP<1>. The second AND gate 85 receives the SELVXCURLP<0>signal. The SELVXCURLP signal is asserted when the VX lines are to be held in a low power mode. The HICUR mode has a higher priority than the low power mode. Signal SELVXCURLP<1> is the signal associated with the VX1 line and SELVXCURLP<0> is for the line VX0.

The output of the first AND gate 84 is provided to a first OR gate 86, a second OR gate 88 and a third AND gate 89. The first OR gate 86 also receives the output from the second AND gate 85. The output of the second AND gate is also provided as an input to the third AND gate 89. The output of the first OR gate 86 is provided to a third OR gate 87 along with the signal SELVXACTIVE<0>. The second OR gate 88 also receives the signal SELVXACTIVE<1>. The output of the third AND gate 89 is provided to a fourth OR gate 82 along with the signal SELVXACTIVE<2>. The output of the inverter 80 is provided to a fourth AND gate 81 along with the signal SELVXACTIVE<3>. The outputs of the third OR gate, the second OR gate, the fourth OR gate and the fourth AND gate thus provide, via a buffer 83, the signals, further block 80 provides the COLCURVX<3:0>signal.

The further blocks 80 differ in the SELVXACTIVE signals applied. The first block has a signal SELVX0ODDACTIVE<3:0>, the second block has a signal SELVX1ODDACTIVE<3:0>, the third block has a signal SELVX0EVENACTIVE<3:0> and the fourth block has a signal SELVX1EVEN<3:0>.

As mentioned, the current sources can be used in three different modes. The first mode with the highest priority is the short VX mode. In that mode, all of the switches shown would be turned on. This would be achieved by asserting the SHORTVX signal and asserting the SELVXACTIVE signals for all both VX lines and all current sources. The output from the blocks 80 would therefore be asserted.

The next mode is the active mode of the VX lines, which is when one or other of the lines are being used to read a pixel. In this mode, it is possible to selectively control which current source is connected to which VX line. In some embodiments, the current sources would be configured such that current sources providing a value of 7i (e.g., a combination of the two 3i current sources and the i current source) is provided to the active line while a current value of i is provided to the inactive line. It should be appreciated that this is by way of example and in other embodiments, the values may be 6i to the active line and 2i to the inactive line. This would be achieved by activating the HICUR signal and controlling the signal VXSEL. In some embodiments, the signal VXSEL has two bits providing four different power options. For example, one option may be to have no current sources coupled to either VX line, other options may be to have one or other VX line coupled to a low level current source (e.g. i or 2i) and another option may be to have both coupled to a low level current source e.g., each coupled to an i current source. It should be appreciated that the inverse of the signal applied to the active line may be applied to the inactive line. In this way, the current sources are coupled to one or other of the active lines.

The final mode is a low-power mode which is asserted using the signal SELVXCURLP. In some embodiments there may be one or more options for the low power mode. In some embodiments, the signal SELVXCURLP has two bits providing four different low power options. For example, one option may be to have no current sources coupled to either VX line, other options may be to have one or other VX line coupled to a high level current source (e.g. 6i or 7i) and another option may be to have both coupled to a low level current source e.g., each coupled to an i current source. It should be appreciated that the arrangement FIG. 6 and the associated control is such that i, 2i, 3i, 4i, 5i, 6i, 7i and 8i can be provided to one line and any remaining current sources couple to the other line. In some embodiments, not all of the current sources may be required.

In the example shown, it is possible control the current source value applied to a given line. This may be used depending on the mode of operation and/or the specific properties of the array itself. Processing variations may for example be compensated for. In some embodiments, the current source value applied may be dependent on the application of the array.

It should be appreciated that in some embodiments, two current sources only may be provided for each pair of lines, one providing current ki and the other providing current i.

It should be appreciated that other embodiments may use other numbers of current sources other than the four shown.

It should be appreciated that in other embodiments, different current values may be provided by one or more of the current sources to those previously described.

It should be appreciated that in some embodiments the different values of k to those mentioned may be used. By way of example only k may be in the range of 2 to 10.

K may not necessarily be an integer. In some embodiments, k may be any umber greater than 1. K may be an integer or a non integer. Other embodiments may use a different switching arrangement to that shown.

It should be appreciated that any other suitable current source arrangement may be used in order to control the current applied to a pair of VX lines to be i and ki.

While examples of 2T arrangements have been shown, it should be appreciated that this is by way of example only. Other embodiments may be used with other pixel transistor structures, for example which make use of two or more read lines. The above described embodiments have been described in relation to MOS transistors. It should be appreciated that in other embodiments, different types of transistors have been used.

One or more integrated circuits may comprise an arrangement described above. Some embodiments may be provided by one or more dies. Some embodiments may be provided by one or more dies and one or more integrated circuits.

Figure 8:
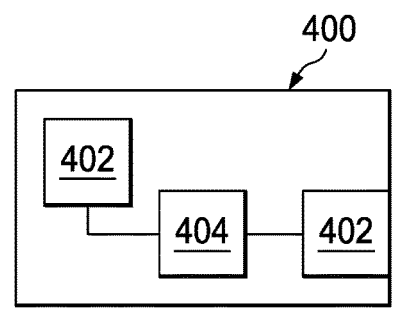
FIG. 8 schematically shows a device in which some embodiments may be provided.

Some embodiments may be provided in an electronic device 400 such as shown in FIG. 8. The device 400 may comprise any one of arrangements as previously described which are referenced 402. An output from the pixel array may be provided to a processor 404. The output of the processor may control for example a display 406 and allow the captured image to be displayed.

It should be appreciated that the device may be any suitable device. By way of example only and without limitation, that device may be a mobile telephone, smart phone, tablet, computer, camera, sensor device or the like.

Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

The invention claimed is:

1. A pixel array, comprising:
 a plurality of pixels arranged in a plurality of columns;
 a plurality of pairs of column lines, each pair of column lines being associated with a column of pixels including first pixels connected to a first column line of said pair and second pixels connected to a second column line of said pair;
 a current source circuit configured to provide current to said pair of column lines during a read of the column of pixels such that when one of the first or second column lines in said pair of column lines is provided with a first current and the other of the first or second column lines in said pair of column lines is simultaneously provided with a second current, the second current having a magnitude which is less than a magnitude of the first current.

2. The pixel array of claim 1, wherein said one of the first or second column lines of said pair of column lines is configured to be active during the read when provided with said first current and the other of the first or second column lines of said pair of column lines is configured to be inactive during the read when provided with said second current.

3. The pixel array of claim 1, wherein the magnitude of said first current is n times larger than the magnitude of the second current, where n is in the range of 2 to 10.

4. The pixel array of claim 3, wherein n is 6 or 7.

5. The pixel array of claim 1, wherein said current source circuit for each pair of column lines comprises a plurality of current sources and a switching circuit, said switching circuit configured to control which current source of said plurality of current sources is coupled to which column line.

6. The pixel array of claim 5, wherein a first switch and a second switch is provided for each current source circuit, said first switch configured to couple one current source to said one of the first or second column lines of said pair of column lines and said second switch is configured to couple another current source to said other of the first or second column lines of said pair of column lines.

7. The pixel array of claim 5, wherein said current source circuit is configured when reading the column of pixels for said pair of column lines to couple at least one current source to both column lines in the pair of column lines.

8. The pixel array of claim 5, wherein said current source circuit is configured when not reading the column of pixels for said pair of column lines to cause a same magnitude current to be provided to each column line in said pair of column lines that is less than the magnitude of the first current.

9. The pixel array of claim 5, wherein said current source circuit is configured to provide a total current of xi, wherein current sources of said current source arrangement are individually selectable to provide a current of i, xi and any integer between 1 and x, x being an integer.

10. The pixel array of claim 9, wherein x is 8.

11. The pixel array of claim 9, wherein four current sources are provided, two current sources each providing a current of i and two current sources each providing a current of 3i.

12. The pixel array of claim 1, implemented on an integrated circuit die.

13. A method of controlling a pixel array, said pixel array comprising a plurality of pixels arranged in a plurality of columns and including a plurality of pairs of column lines, each pair of column lines being associated with a column of pixels including first pixels connected to a first column line of said pair and second pixels connected to a second column line of said pair, said method comprising:
providing current to said pair of column lines during a read of the column of pixels such that when one of the first or second column lines in said pair of column lines is provided with a first current and the other of the first or second column lines in said pair of column lines is simultaneously provided with a second current, the second current having a magnitude which is less than a magnitude of the first current.

14. The method of claim 13, wherein providing comprises providing said first current such that said one of the first or second column lines of the pair of column lines is active and providing said second current such that the other of the first or second column lines of the pair of column lines is inactive.

15. The method of claim 13, wherein the magnitude of said first current is n times larger than the magnitude of the second current where n is in the range of 2 to 10.

16. The method of claim 15, wherein n is 6 or 7.

17. The method of claim 13, further comprising controlling which of a plurality of current sources is coupled to which column line.

18. The method of claim 17, wherein controlling comprises controlling one or more of a first switch and a second switch, wherein said first switch is configured to couple a current source to said one of the first or second column lines of said pair of column lines and said second switch is configured to couple said current source to said other of the first or second column lines of said pair of column lines.

19. The method of claim 17, further comprising, when not reading the column of pixels for said pair of column lines, coupling one or more current sources to both the first and second column lines of said pair of column lines.

20. The method of claim 19, further comprising, when not reading the column of pixels for said pair of column lines, causing the current provided to each of said first and second column lines to be less than the first current.

21. A pixel circuit, comprising:
a plurality of pixels arranged in a single pixel column, said single pixel column including a first column line coupled to first pixels of said plurality of pixels and a second column line coupled to second pixels of said plurality of pixels;
a current source circuit operating during a read of one of the pixels in said single column of pixels to provide a first current to said first column line and provide a second current to said second column line, the first and second currents applied simultaneously during said read, the second current having a magnitude which is different than a magnitude of the first current.

22. The pixel circuit of claim 21, wherein said current source circuit provides the magnitude of the first current greater than the magnitude of the second current when said first column line is configured to be active during the read and said second column line is configured to be inactive during the read.

23. The pixel circuit of claim 22, wherein the magnitude of said first current is n times larger than the magnitude of the second current, where n is in the range of 2 to 10.

24. The pixel circuit of claim 23, wherein n is 6 or 7.

25. The pixel circuit of claim 21, wherein said current source circuit provides the first and second currents to the first and second column lines, respectively, having a same magnitude when not reading one of the pixels in said single column of pixels.

* * * * *